United States Patent [19]

Schierz

[11] Patent Number: 4,672,422
[45] Date of Patent: Jun. 9, 1987

[54] SEMICONDUCTOR RECTIFIER UNIT

[75] Inventor: Winfried Schierz, Roth, Fed. Rep. of Germany

[73] Assignee: SEMIKRON Gesellschaft für Gleichrichterbau und Elektronik m.b.H., Nuremberg, Fed. Rep. of Germany

[21] Appl. No.: 779,597

[22] Filed: Sep. 24, 1985

Related U.S. Application Data

[63] Continuation of Ser. No. 437,757, Oct. 29, 1982, abandoned.

[30] Foreign Application Priority Data

Oct. 31, 1981 [DE] Fed. Rep. of Germany ....... 3143336

[51] Int. Cl.[4] .................. H01L 21/447; H01L 23/40; H01L 23/46
[52] U.S. Cl. ....................................... 357/82; 357/81; 357/79
[58] Field of Search ................. 357/72, 74, 68, 82, 357/79, 81

[56] References Cited

U.S. PATENT DOCUMENTS

| 3,333,163 | 7/1967 | Wislocky | 357/79 X |
| 3,412,294 | 11/1968 | Sciaky | 357/81 |
| 3,443,168 | 5/1969 | Camp et al. | 357/79 |
| 3,471,757 | 10/1969 | Sias | 317/234 |
| 3,643,131 | 2/1972 | Scherbaum | 357/82 X |
| 3,784,885 | 1/1974 | Weidemann | 357/82 |
| 4,037,246 | 7/1977 | Pellant et al. | 357/82 |
| 4,129,881 | 12/1978 | Reichel et al. | 357/81 |
| 4,183,042 | 1/1980 | Novak et al. | 357/82 |
| 4,218,695 | 8/1980 | Egerbacher et al. | 357/79 |
| 4,268,850 | 5/1981 | Lazarek et al. | 357/82 |

FOREIGN PATENT DOCUMENTS

| 1564613 | of 0000 | Fed. Rep. of Germany . |
| 1614445 | 9/1970 | Fed. Rep. of Germany . |
| 1589847 | 2/1971 | Fed. Rep. of Germany . |
| 2728564 | 1/1979 | Fed. Rep. of Germany . |
| 2813529 | 10/1979 | Fed. Rep. of Germany . |

OTHER PUBLICATIONS

Solid State A.C. Controllers for Resistance Welding, AEI Semiconductors.

Primary Examiner—Andrew J. James
Assistant Examiner—S. V. Clark
Attorney, Agent, or Firm—Spencer & Frank

[57] ABSTRACT

A semiconductor rectifier unit composed of at least two rectifier elements, plate-shaped contact elements contacting each rectifier element, components producing spring pressure for clamping the rectifier elements between the contact elements, and a carrier body supporting the rectifier elements, contact elements and clamping components. Each rectifier element is composed of a semiconductor body having contact electrodes on opposite surfaces thereof and two contact members contacting the electrodes and forming a separable stack with the semiconductor body. A body of insulating material surrounds each rectifier element and is interposed between the contact elements to define therewith an enclosure for each rectifier element, and sealing rings form a sealed joint between the body of insulating material and each contact element for sealing the enclosure for each rectifier element. At least one plate-shaped cooling element is associated with, and dimensionally matched to, each rectifier element and is connected to one side of its associated rectifier element. The clamping components include at lest one member located at the side of the cooling element remote from the associated rectifier element for loading each rectifier element with a given contact pressure.

19 Claims, 4 Drawing Figures

SEMICONDUCTOR RECTIFIER UNIT

This application is a continuation, of application Ser. No. 06/437,757, filed Oct. 29th, 1982.

BACKGROUND OF THE INVENTION

The present invention relates to a semiconductor rectifier unit of the type in which at least two rectifier elements are clamped by means of spring pressure between plate-shaped contact elements, are contacted and electrically connected, and are fastened to a carrier body.

Controllable semiconductor rectifier elements called thyristors are known to be switchable from their nonconductive to their conductive state at any desired time by the application of a pulse to the control electrode when there appears between the main current conductors of the element an alternating voltage halfwave which biases the element in the forward direction. Due to this advantageous characteristic and other known advantages, thyristors are increasingly used to switch and control high currents, e.g. in the welding art, for example in antiparallel connection as so-called a.c. regulators.

Rectifier arrangements of this type are available on the market in various embodiments. For example, in one such arrangement two so-called wafer cells are arranged in one plane spatially and electrically in parallel opposition between two plate-shaped metal bodies common to both cells. The rectifier elements are cooled on both sides and the metal bodies are designed for liquid cooling and rest with one face against adapted, plate-shaped conductor members. The rectifier elements and the adjacent components are pressure contacted with the aid of clamping bolts disposed between the rectifier elements on both sides of the conductor members and each clamping bolt acts on a stack of spring bodies. Such arrangements are made in an open structure. At their narrow, free longitudinal sides, the cooling bodies are provided with fittings for the connection of coolant lines.

Such embodiments, however, have various drawbacks. The wafer cells employed with their semiconductor body accommodated in a ceramic ring and special contact metals which are tightly fastened on both sides are expensive to produce. There further exists the need of sorting out these cells within close height tolerances due to their common rigid contacting. Moreover, only cells having plane parallel contact faces can be used.

Further, the use of leaf springs in the known balance arm construction does not provide sufficient pressure precision for jointly pressure contacting both cells.

Finally, the known design does not permit an electrically insulated arrangement of the cooling bodies with respect to the current conducting members so that, specifically when used under higher blocking voltages, expensive coolant lines are required.

DE-OS No. 2,813,529 [Federal Republic of Germany Laid Open Application] discloses an arrangement for cooling both sides of semiconductor elements. Here, at least two semiconductor elements with their disc-shaped housing, each having two electrodes, are attached between two raillike cooling bodies which are provided with channels for the passage of a coolant. Moreover, a clamping device is provided for pressing the cooling bodies to the electrodes of the components. To compensate for differences in height in the components, compensating bodies are provided which are connected, for example, with the cooling bodies by means of screws. By screwing of the compensating bodies, the components can be electrically and thermally connected with the cooling body via these compensating bodies. A lack of plane parallelism in the components cannot be regulated. Due to the reduction in surface area produced by the contact between compensating body and component, cooling of the components is not optimum.

DE-AS [Federal Republic of Germany Published Application] No. 1,589,847, specifically FIG. 9 thereof, discloses a design in which, likewise with the aid of a balance bar construction, two rectifier elements are pressure contacted and mounted by means of a clamping bolt. The above stated limitations also apply to this design.

SUMMARY OF THE INVENTION

It is an object of the present invention to provide a semiconductor rectifier unit of the above-mentioned type in which two or more semiconductor rectifier elements, which are controllable if required, can be constructed inexpensively and are connected independently of dimensional tolerances with cooling components and conductors by pressure contacting in a simple and economical assembly with a given and reproduceable contact pressure.

The above and other objects are achieved, according to the invention, by the provision of a novel semiconductor rectifier unit composed of: at least two rectifier elements; plate-shaped contact elements contacting each rectifier element; components producing spring pressure for clamping the rectifier elements between the contact elements; and a carrier body supporting the rectifier elements, the contact elements and said clamping components. Each rectifier element is composed of a semiconductor body having contact electrodes on opposite surfaces thereof and two contact members contacting the electrodes and forming a separable stack with the semiconductor body. The unit further includes a body of insulating material surrounding each rectifier element and interposed between the contact elements to define therewith an enclosure for each rectifier element, in which each rectifier element is connected between the contact elements, sealing rings associated with the body of insulating material to form a sealed joint between that body and each contact element for sealing the enclosure for each rectifier element, and at least one plate-shaped cooling element associated with, and dimensionally matched to, each rectifier element and connected to one side of its associated rectifier element. The clamping components include at least one member located at the side of the cooling element remote from the associated rectifier element for loading each rectifier element with a given contact pressure.

According to one embodiment of the invention, the rectifier elements may be contacted at one side with a common cooling body and at their respective other side with a separate cooling element which is connected with the adjacent cooling element by means of a bar. Each of the rectifier elements is then disposed in an annular body of insulating material which, with the aid of special shaping of its frontal faces, which are in engagement with matching configurations of the contact elements, is fixed between these contact elements.

According to another advantageous embodiment of the present invention employing the above-mentioned arrangement of the rectifier elements between a common cooling body and separate cooling elements, each one of the rectifier elements is disposed in a plate-shaped body of insulating material which has a through opening for the accommodation of the rectifier element and through bores symmetrical with the center point of the opening, and the rectifier element is fixed between the contact elements with the aid of clamping bolts of the pressure contacting device which traverse the through bores.

According to another advantageous embodiment, each side of each rectifier element may be contacted with a separate cooling element, with adjacent cooling elements on one side being connected together by means of a bar, and all rectifier elements are arranged in a common plateshaped body of insulating material which is provided with a corresponding number of through openings and with through bores symmetrical with respect to the center point of each opening for the passage of clamping bolts of the pressure contacting device and which is fastened between the contact elements with the aid of these clamping bolts.

The contact elements on each side of the rectifier elements may be conductor members which are firmly connected with the cooling elements or with the common cooling body.

Since cooling elements frequently also serve to conduct current, the cooling elements as well as the common cooling body may be provided as contact elements which are firmly connected with the conductor members.

The insulating bodies provided to accommodate at least one rectifier element are each provided at their frontal faces, or at their connecting faces toward the contact elements, with a configuration, preferably a recess, suitable to accommodate a sealing ring.

The bar which connects respectively adjacent cooling elements has a longitudinal channel via which the coolant channels disposed in the cooling elements are connected together.

When the cooling elements are arranged to serve as contact elements, all cooling elements for one side of the rectifier elements are contacted via a common conductor member.

If conductor members are provided as contact elements, these may be firmly connected with the cooling elements of the corresponding side of the rectifier elements either electrically insulated via an intermediate insulating layer of thermally highly conductive material or electrically conductively without such intermediate layer.

Preferably all rectifier elements, which may be arranged spatially and electrically in parallel aiding or in parallel opposition, are disposed in one plane.

When controllable rectifier elements are used which have a central control electrode, the control conductor terminal is brought axially through the adjacent components.

The pressure contacting device comprising Belleville springs, clamping bolts and a terminating pressure plate permits the use of commercially available Belleville springs with given spring path characteristics and thus a predetermined and reproducible contact pressure.

The contact elements, cooling elements and bodies of insulating material provided with through bores for common fastening with the aid of the pressure contacting device may each be provided with a tube of insulating material or with a plastic coating for the electrically insulated passage of the clamping bolts.

The carrier body on which the rectifier unit according to the invention is fastened is preferably designed in the form of an angular profile and is provided on one arm with through bores arranged to correspond in position and dimensions to permit passage of the clamping bolts. These bolts serve to firmly connect the structure comprising the rectifier element, the conductor members and the cooling elements with one arm of the carrier body.

BRIEF DESCRIPTION OF THE DRAWING

The present invention is illustrated and will be explained with the aid of the embodiments shown in FIGS. 1 to 3.

FIG. 1b is an elevational view of an embodiment similar to that of FIG. 1a.

Identical parts bear the same reference numerals in all drawing figures.

DESCRIPTION OF THE PREFERRED EMBODIMENTS

Figure 1A:
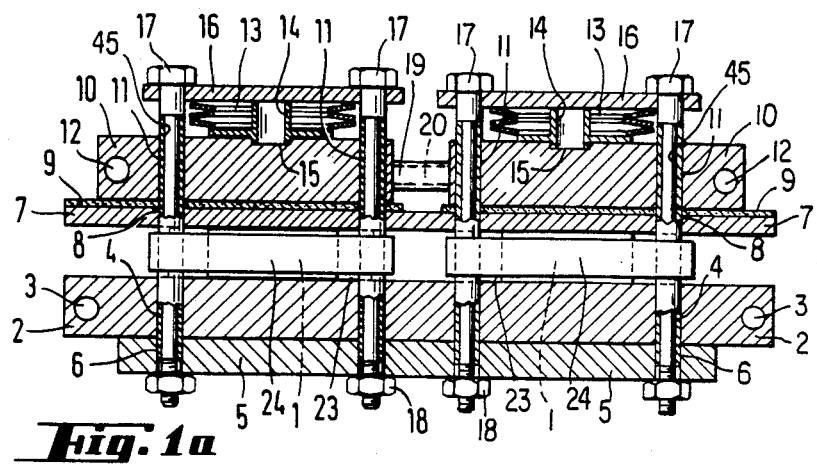
FIG. 1a is a cross-sectional view of a rectifier unit containing two rectifier elements according to a preferred embodiment of the invention.

In the structure shown in FIG. 1a, two rectifier element 1 are each connected, at one contact side, to a cooling member 2 and at its other contact side to a conductor member 7. These two adjacent components 2 and 7 constitute contact elements and form, together with a body 24 of insulating material shown in FIG. 2, the housing for a stack formed of the semiconductor body and its contact members, as will be described in greater detail with reference to FIG. 3. Sealing rings 23, shown in FIG. 3, at the frontal faces of the body 24 of insulating material assure a tight enclosure of said stack.

The cooling member 2 includes at least one coolant channel 3 provided with an opening for the influx of coolant.

On its side facing away from the rectifier element 1, the conductor member 7 is permanently fastened directly to an electrically insulating intermediate layer 9 which is preferably made of a thermally well conductive metal oxide and, via this layer serving as electrical insulation, conductor member 7 is connected to a further cooling member 10, each connection preferably being by soldering.

The lower cooling member 2 is a continuous and common cooling body for both rectifier elements 1 and, according to the invention, each of the rectifier elements has an associated separate, upper cooling member 10, called a cooling element, to compensate for different structural heights of the rectifier elements. These separate cooling elements are likewise designed to permit the circulation of a coolant through a channel 12.

Figure 1B:
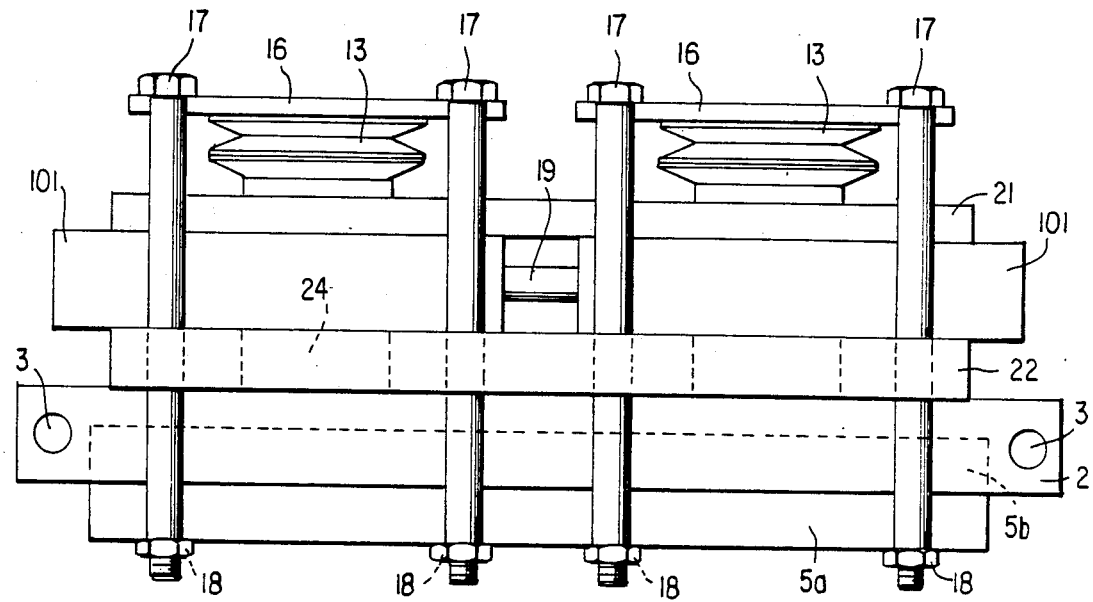

On its side facing away from the rectifier element, the cooling body 2, which simultaneously serves to conduct current, rests against the bar, or leg, 5a of a supporting body 5 designed in the form of an angle profile. The other leg 5b of the angle profile body 5 being arranged at the back side of the assembly according to FIG. 1b is Illustrated by dotted lines.

The assembly comprising the cooling body 2 and conductor member 7, constituting contact elements, and cooling element 10 and rectifier element 1 is clamped together to the bar 5a, with the aid of a pressure contacting device comprising Belleville springs 13, a centering member 14 for the Belleville springs, a pressure plate 16 and clamping bolts 17 and threaded nuts 18.

A suitable recess 15 in the cooling element 10 serves to fix the position of the centering member 14. In order to be jointly aligned and centered with the aid of the clamping bolts, cooling body 2, cooling element 10, conductor member 7 and supporting bar 5a are provided with corresponding through botes 4, 11, 8, 6. In case there exists a requirement for electrically insulated passage of the clamping bolts, these aligning and centering bores are dimensioned in such a way that an additional insulating tube 45 or insulating coating may be provided as illustrated in FIG. 1a.

FIG. 1a shows one-half of a rectifier unit according to the invention, so that the other half will be a mirror-image of the half shown. Parts 5a, 2, 7 and 19 are shown broken away along their right-hand edges, signifying that those parts extend across the non-illustrated half of the unit. Parts 1, 24, 9, 10, 13 and 16 are shown in their entirety, signifying that a second, separate set of these parts is provided in the non-illustrated half of the unit. The embodiment according to FIG. 1b differs from that in FIG. 1a in the following respects an extensive insulating body 22 is provided accommodating all rectifier elemants 1 wherein the aperture for one of said elements is presented by dotted lines a cooling element 101 is mounted directly on body 22, and corresponds to the element 10 regarding its form and its connection to similar components by a bar 19, element 101 moreover serving as a current conductor; and a plate-shaped conductor member 21 is provided as a common contact plate for all semiconductor elements. This conductor member 21 is pressed to each of the cooling elements 101 with a respective aid of the pressure contacting device independently of dimensional tolerances. In the embodiment according to FIG. 1b therefore an insulating intermediate layer is not included. All components shown in FIG. 1b are clamped with the aid of pressure contacting devices. The other leg 5b of the supporting body 5 at the back side of the structure is shown in broken lines. The mutual positions of the components 22,101, 21 was chosen in order to show their particular conformity with corresponding components in FIG. 1a.

Figure 2:
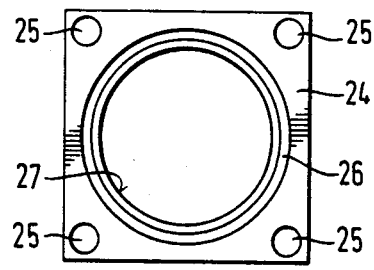
FIG. 2 is a top plan view of a body of insulating material provided to accommodate the rectifier element according to the invention.

As shown in FIG. 2, a housing member for rectifier element 1 is a plate-shaped body 24 of insulating material which is provided at its four corners—in an exemplary square structure extension—with through bores 25 which are symmetrical with the center point for guiding the clamping bolts 17 of the pressure contacting device. A preferably central through opening 27 serves to accommodate the rectifier element, which is composed of a stack formed by a semiconductor body and contact members, as shown in greater detail in FIG. 3. Each of the two flat sides, or end faces, of the body 24 of insulating material is provided with a recess 26, which may be groove-shaped and which is congruent with the recess on the other side and concentrically encloses opening 27 for accommodating a sealing ring 23.

The height of the body 24 of insulating material depends on certain requirements, namely that the stack composed of the semiconductor body and the contact members and constituting the rectifier element must rest against the adjacent contact elements 2 and 7, when pressure contacting is established, and that the sealing rings 23, in the contacted state of the unit, must experience a certain deformation to assure a tight seal between the semiconductor body and the contact pieces. The groove-shaped recesses 26 of the body 24 of insulating material must have suitable corresponding dimensions. Commercially available sealing rings 23 can here be used. The body 24 of insulating material is composed of a material customarily used in the semiconductor art, for example a synthetic resin or rubber.

The contact elements 2 and 7 are preferably made of copper, and the supporting body 5 for fastening of the structure is made of a material having great mechanical strength. The connecting faces of all mutually adjacent components are made planar by special surface treatment. Commercially available Belleville springs 13 are provided for the pressure contacting device and have spring characteristics which permit identical, reproducible stressability and can be set without difficulty when the unit is assembled.

The two cooling elements 10 or 101 of the respective devices shown in FIGS. 1a and 1b are connected together by means of a bar 19 which may have a longitudinal channel 20 to provide a connection for the coolant channels provided in the two cooling elements. The bar 19 may be a tubular element as illustrated in each of FIGS. 1a and 1b. It may be formed out of a commercially available material and treated by known manner for fastening to the cooling members.

In order to assure the desired height compensation as well as make possible the use of rectifier elements having nonplane parallel outer faces and assure their fault-free contacting, each rectifier element according to the invention has at least one separate associated cooling element. In the case of a structure having a common cooling body on one side of the rectifier elements, a separate body of insulating material is here provided for each one of the elements to form part of the housing. This body of insulating material may be an annular body having a special shape at its frontal faces, which engage with corresponding configurations of the contact elements so as to fix the position of the housing members. Alternatively, a plate-shaped body of insulating material may be provided which, with the aid of coinciding through bores in the housing members of each rectifier element, is fixed between the contact elements so as to align the rectifier elements on clamping bolts.

In the case of a structure having cooling elements on both sides of each rectifier element, all rectifier elements have, as indicated in FIG. 1b, a common, continuous body 22 of insulating material with corresponding openings to accommodate the rectifier element stacks and recesses for the attachment of sealing rings as well as bores for the insertion of clamping bolts for pressure contacting between the cooling elements.

Each cooling element on one side of the rectifier elements is fixed to the adjacent cooling elements on that side by means of a bar 19 and all cooling elements on each side are connected together either directly via a terminating conductor member 21, as shown in FIG. 1b, or via an intermediate layers of electrically insulating but thermally well conducting material. The latter of the two connection arrangements is provided for working with potentialfree coolant conditions.

Since cooling elements 10 and 101 and connecting bars 19 may also be made of copper and bars 19 have a comparatively small cross section, the connecting bars 19 do not constitute a rigid connection with respect to adjacent partial arrangements when each rectifier element is contacted with its contacting elements and with further components. Rather these bars permit proper thermal and electrical contact to be established between all rectifier elements, independent of tolerances in structural height and contacting faces which are not plane parallel.

Figure 3:
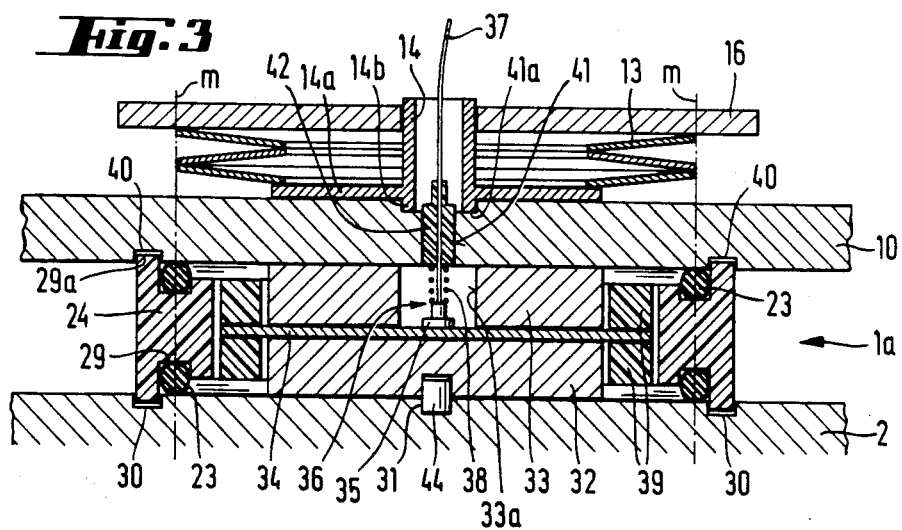
FIG. 3 is essentially a cross-sectional view of the structure of a controllable rectifier element according to the invention and its assembly with other components.

FIG. 3 shows the design of a rectifier element in association with cooling elements as the contact elements and the arrangement of the control conductor when controllable rectifier elements are used.

Rectifier element 1a includes a semiconductor body 34, which is provided in the edge region of each contact side with a respective electrically insulating and protecting cover 39. In order to aid placement of the semiconductor body in the housing in a defined position, each cover 39 may have a shape which is adapted to the arrangement, for example a rectangular cross section as shown.

At each contact face of semiconductor body 34 there is disposed a respective one of the loose metallic contact members 32 and 33. All contact faces of adjacent members are given the optimum planar configuration. The lower contact member 32 is fixed via a centering pin 44 which engages in a central recess in that contact face of member 32 which is directed toward the cooling body 2 and in a corresponding recess 31 in that cooling body 2. The stack formed of semiconductor body 34 and contact member 32 and 33 constitutes a rectifier element and is enclosed by an annular body 24 of insulating material.

In order to prevent undesirable displacement toward the semiconductor body with damaging results for the semiconductor body, the body 24 of insulating material is likewise mounted in a special manner. For this purpose, it is provided with a raised portion 29a at each frontal, or end, face which is radially outside a reess 29 that serves to accommodate a sealing ring 23. In the contacted state, each raised portion 29a engages in a corresponding recess 30 or 40, respectively, in the adjacent contact element 2 or 10, respectively.

For contacting of central control electrode 35 of body 34 and for passing through a control line terminal 36 a through bore 33a is provided in the upper contact piece 33. The adjacent cooling element 10 has a passage opening 41 concentric with bore 33a. An element 42 in opening 41 forms an electrically insulated passage. Opening 41 is provided at the upper end with a step-shaped projection 41a and a frontal projection 14b of centering member 14 engages in this recess 41a so as to position the centering member 14 concentrically with the insulated passage 42. Centering member 14 further includes a flang 14a on which the Belleville springs 13 of the pressure contacting device are stacked.

The control line terminal 36 in the interior of the housing is fixed to an outer control current conductor 37 via the passage 42.

A terminating pressure plate 16 of steel is placed onto the Belleville springs 13 which are shown schematically.

The vertical broken lines m indicate the position and extent of the clamping bolts 17 of the pressure contacting device.

The control electrode 35 may likewise be pressure contacted under the influence of a spring body 38 pressing terminal 36 against electrode 35.

In the structure shown in FIG. 1b, which includes cooling members as contact elements and where a conductor member 21 is adjacent the cooling element 101, the conductor member 21 may be provided, in addition to the through bores for aligning it on clamping bolts 17, also with passages for control conductors.

The control conductors 37 of the controllable semiconductor elements may also be arranged in a plane perpendicular to the stacking direction of the components of the unit according to the invention. Then, the centering piece 14 provided for the concentric arrangement of the plate springs 13, must be made of thicker material, for example at its flange 14a, and is provided with a radial recess, or a plate-shaped insulating member with a corresponding radial recess is provided in addition to the pressure plate 16 to accommodate the control current conductor or conductors.

When the semiconductor rectifier unit according to the invention is manufactured, and this is an advantage of this unit which is significant for the invention, the appropriately pretreated and prefabricated components are merely assembled in stacks in the sequence shown in FIG. 3. After placing the clamping bolts 17 on bar 5, the cooling body 2 and then the individual components of the rectifier element 1, 1a, i.e. contact member 32, semiconductor body 34 and contact member 33, then the body 24 of insulating material, which has already been equipped with the sealing rings 23, and then cooling element 10 and the pressure contacting device are aligned on the provided profiled bar 5 of the carrier body. Such an assembly is made separately for each rectifier element and permits, in the most economic manner, the fabrication of such units. Clamping is possible on the basis of the spring characteristic known for the plate springs 13 employed for a given contact pressure and is reproducible over a broad range.

The advantages of the present invention, in addition to those mentioned as being significant for the invention, are that no sorting work is required to select rectifier elements having the same structural height and plane parallel contact faces and that all parts of the rectifier element as well as of the total structure are replaceable without having to discard other parts as well.

It will be understood that the above description of the present invention is susceptible to various modifications, changes and adaptations, and the same are intended to be comprehended within the meaning and range of equivalents of the appended claims.

What is claimed is:

1. A semocinductor rectifier unit comprising: at least two rectifier elements; plate-shaped contact elements contacting each said rectifier element; means producing spring pressure for clamping each said rectifier element between said contact elements; and a carrier body supporting said at least two rectifier elements, said contact elements and said clamping means, wherein each said rectifier element comprises a semiconductor body having contact electrodes on opposite surfaces thereof and two contact members contacting said electrodes and forming a separable stack with said semiconductor body, said contact members being loosely assembled with said semiconductor body to permit ready disassembly of said contact members from said semiconductor body; said unit further comprising a body of insulating material surrounding each said rectifier element and interposed between said contact elements to define therewith an enclosure for each said rectifier element, in which each said rectifier element is connected between said contact elements, sealing rings associated with said body of insulating material to form a sealed joint between said body of insulating material and each said contact element for sealing said enclosure for each said rectifier element, at least two plate-shaped cooling elements each associated with, and dimensionally matched to, a respective said rectifier element and disposed at one side of its associated rectifier element, and a yieldable bar member connected between said cooling elements; and further wherein said means producing spring pressure comprise a respective pressure contacting device for each said rectifier element located at the side of said cooling element remote from said associated rectifier element for individually loading its associated said rectifier element with a given contact pressure.

2. A rectifier unit as defined in claim 1 wherein: said unit further comprises a cooling body common to all of said rectifier elements and contacting that side of each said rectifier element which is opposite the side at which said associated cooling element is connected, and said body of insulating material is provided with an opening shaped to surround at least one said rectifier element and having opposed end faces each directed toward a respective one of said contact elements which contact said one rectifier element.

3. A rectifier unit as defined in claim 2 wherein each said end face of said body of insulating material is configured for accommodating a sealing ring.

4. A rectifier unit as defined in claim 2 wherein said cooling body and said cooling elements are provided with coolant channels for liquid coolant, and said bar is provided with a longitudinal channel for interconnecting said coolant channels provided in said cooling elements.

5. A rectifier unit as defined in claim 1 wherein: said unit further comprises a cooling body common to all of said rectifier elements and contacting that side of each said rectifier element which is opposite the side at which said associated cooling element is connected; said body of insulating material is plate-shaped and is provided with a through opening shaped to surround at least one said rectifier element and with a plurality of through bores symmetrically arranged relative to the center of said through opening; and said pressure contacting device for said one rectifier element comprises clamping bolts extending through said through bores for fixing said body of insulating material between said contact elements which contact opposite sides of said one rectifier element.

6. A rectifier unit as defined in claim 1 wherein: each of said plate-shaped cooling elements contacts its associated rectifier; said unit further comprises at least two additional cooling elements each contacting a respective rectifier element at the side thereof opposite the one side of said rectifier element; said body of insulating material is common to all of said rectifier elements and is provided with a plurality of openings each shaped to surround a respective rectifier element and with groups of through bores, each group being symmetrically arranged relative to the center of a respective one of said openings; and each said pressure contacting device comprises clamping bolts extending through said through bores for fixing said body of insulating material between said contact elements which contact opposite sides of each said rectifier element.

7. A rectifier unit as defined in claim 1 wherein said contact elements are current conductor members at least one of which is securely connected with said cooling element.

8. A rectifier unit as defined in claim 1 wherein each said cooling element constitutes one of said contact elements for one said rectifier element, and further comprising a cooling body common to all said rectifier elements and constituting one said contact element for each said rectifier element, and current conductor members permanently connected to said contact elements.

9. A rectifier unit as defined in claim 1 wherein each of said cooling elements constitutes one of said contact elements for a respective one of said rectifier elements and all of said cooling elements are disposed at the same side of said rectifier elements for conducting current, and further comprising a single current conductor member connected to all of said cooling elements.

10. A rectifier unit as defined in claim 1 wherein all of said cooling elements are disposed at the same side of said rectifier elements, and said contact elements include one such element which is common to all of said rectifier elements, is disposed at the same side of said rectifier elements as said cooling elements, and is secured to said cooling elements.

11. A rectifier unit as defined in claim 1 wherein all of said rectifier elements are positioned in a common plane.

12. A rectifier unit as defined in claim 1 wherein each said rectifier element is a controllable rectifier having a control electrode.

13. A rectifier unit as defined in claim 12 wherein said control electrode of each said rectifier element is located at the center of one surface of said associated semiconductor body, and said contact member contacting said contact electrode at said one surface of said semiconductor body and contact element contacting that said contact member are provided with openings for the passage of a conductor for said control electrode.

14. A rectifier unit as defined in claim 1 wherein said pressure contacting device for each said rectifier element comprises at least one Belleville spring, a pressure plate bearing against said spring and clamping bolts coupled to said pressure plate for causing said sprinq to apply clamping pressure to said rectifier element.

15. A rectifier unit as defined in claim 1 wherein said contact elements, said cooling elements and said cooling body are provided with through bores each lined with a tube of insulating material or with a plastic coating so as to provide an insulated passage, and said pressure contacting devices comprise clamping bolts passing through said insulated passages.

16. A rectifier unit as defined in claim 1 wherein: said carrier body has the form of an angle profile provided with an arm; said rectifier elements, said contact elements and said cooling elements form an assembly carried by said arm of said carrier body; and said pressure contacting devices comprise clamping bolts firmly connecting said assembly with said arm.

17. A rectifier unit as defined in claim 1 wherein each said pressure contacting device comprises: a pressure applying member; spring means interposed between said pressure applying member and the side of said cooling element which is remote from said associated rectifier means, said spring means having a center axis which is axially centered with respect to said enclosure for said associated rectifier element; and a plurality of clamping elements distributed symmetrically around said spring means and operatively coupled to said pressure applying member, each said clamping element being individually adjustable for applying to said spring means a clamping force which is applied to said spring means at a location laterally offset from said center axis of said spring means.

18. A rectifier unit as defined in claim 17 wherein each said clamping element comprises a clamping bolt connected to said carrier body for clamping said spring means, said associated rectifier element and said contact elements contacting said associated rectifier element between said pressure applying member and said carrier body.

19. A rectifier unit as defined in claim 18 wherein said body of insulating material is provided with through bores through which said clamping bolts pass for positioning said body of insulating material relative to said carrier body and said pressure applying member.

* * * * *